(12) United States Patent
Kojima et al.

(10) Patent No.: US 12,374,534 B2
(45) Date of Patent: Jul. 29, 2025

(54) MEMBER FOR SEMICONDUCTOR MANUFACTURING APPARATUS

(71) Applicant: NGK Insulators, Ltd., Nagoya (JP)

(72) Inventors: Mitsuru Kojima, Handa (JP); Hiroshi Takebayashi, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 171 days.

(21) Appl. No.: 18/176,562

(22) Filed: Mar. 1, 2023

(65) Prior Publication Data

US 2024/0055240 A1     Feb. 15, 2024

Related U.S. Application Data

(63) Continuation of application No. PCT/JP2022/030758, filed on Aug. 12, 2022.

(51) Int. Cl.
*H01L 21/683* (2006.01)
*H01J 37/32* (2006.01)

(52) U.S. Cl.
CPC ...... *H01J 37/32724* (2013.01); *H01L 21/683* (2013.01); *H01L 21/6833* (2013.01); *H01J 2237/002* (2013.01); *H01J 2237/2007* (2013.01)

(58) Field of Classification Search
CPC ... H01L 21/683; H01L 21/6833; H01L 21/67; H01L 21/67103; H01L 21/68735;
(Continued)

(56) References Cited

U.S. PATENT DOCUMENTS

2009/0034147 A1   2/2009 Narendrnath et al.
2010/0232750 A1   9/2010 Mizue et al.
(Continued)

FOREIGN PATENT DOCUMENTS

JP   H10-149580 A   6/1998
JP   2003-213886 A   7/2003
(Continued)

OTHER PUBLICATIONS

Korean Office Action (with English translation) dated Aug. 1, 2024 (Application No. 10-2023-7007741).
(Continued)

*Primary Examiner* — Danny Nguyen
(74) *Attorney, Agent, or Firm* — BURR PATENT LAW, PLLC (57) ABSTRACT

A member for semiconductor manufacturing apparatus includes a ceramic plate incorporating an electrode; a ceramic plate through hole extending through the ceramic plate in an up-and-down direction; a base plate having electrical conductivity and located adjacent to a lower surface of the ceramic plate; a base plate through hole extending through the base plate in the up-and-down direction; an insulating sleeve inserted into the base plate through hole and having an outer circumferential surface adhered to an inner circumferential surface of the base plate through hole with an adhesive layer therebetween; and a sleeve through hole extending through the insulating sleeve in the up-and-down direction and communicating with the ceramic plate through hole, wherein the insulating sleeve has at least one ring-shaped or spiral outer circumferential groove on the outer circumferential surface of the insulating sleeve except for an upper end portion of the insulating sleeve.

10 Claims, 6 Drawing Sheets

(58) Field of Classification Search
CPC ............. H01L 21/68714; H01L 21/687; H01L 21/6831; H01J 37/32724; H01J 2237/002; H01J 2237/2007
USPC ........................................................ 361/234
See application file for complete search history.

(56) References Cited

U.S. PATENT DOCUMENTS

| | | | |
|---|---|---|---|
| 2015/0288243 A1 | 10/2015 | Song et al. | |
| 2018/0025933 A1* | 1/2018 | Ishimura | H01L 21/6833 269/8 |
| 2019/0131163 A1 | 5/2019 | Kuno et al. | |
| 2020/0335384 A1* | 10/2020 | Chiba | H01J 37/32733 |
| 2022/0028719 A1 | 1/2022 | Takemori | |

FOREIGN PATENT DOCUMENTS

| | | |
|---|---|---|
| JP | 2005-033125 A | 2/2005 |
| JP | 2007-071274 A | 3/2007 |
| JP | 2009-065133 A | 3/2009 |
| JP | 3154629 U | 10/2009 |
| JP | 2010-210920 A | 9/2010 |
| JP | 3182120 U | 3/2013 |
| JP | 10-2015-0115242 A | 10/2015 |
| JP | 2018-194280 A | 12/2018 |
| JP | 2021-132177 A | 9/2021 |
| WO | 2018/216797 A1 | 11/2018 |
| WO | 2020/111194 A1 | 6/2020 |

OTHER PUBLICATIONS

International Search Report and Written Opinion (Application No. PCT/JP2022/030758) dated Sep. 20, 2022.
English translation of the International Preliminary Report on Patentability (Chapter I) dated Feb. 27, 2025 (Application No. PCT/JP2022/030758).

* cited by examiner

MEMBER FOR SEMICONDUCTOR MANUFACTURING APPARATUS

BACKGROUND OF THE INVENTION

1. Field of the Invention

The present invention relates to a member for semiconductor manufacturing apparatus.

2. Description of the Related Art

A known member for semiconductor manufacturing apparatus includes a ceramic plate incorporating an electrode and a conductive base plate located adjacent to a lower surface of the ceramic plate. For example, PTL 1 discloses a member for semiconductor manufacturing apparatus of this type that includes a ceramic plate through hole extending through the ceramic plate in the thickness direction, a base plate through hole extending through the base plate in the thickness direction, and an insulating sleeve inserted into the base plate through hole and having an outer circumferential surface adhered to an inner circumferential surface of the base plate through hole with an adhesive layer therebetween. The insulating sleeve has a large diameter portion located away from the ceramic plate and a small diameter portion located adjacent to the ceramic plate. A gap between the small diameter portion and the base plate through hole is filled with an adhesive. It is explained that this can firmly fix the insulating sleeve to the base plate through hole.

CITATION LIST

Patent Literature

PTL 1: JP 3182120 U

SUMMARY OF THE INVENTION

However, when the insulating sleeve having an adhesive on the small diameter portion is inserted into the base plate through hole, the central axis of the small diameter portion tends to largely tilt with respect to the central axis of the base plate through hole. Thus, the adhesive on the small diameter portion is readily scraped off by the base plate through hole. Thus, in some cases, the gap between the insulating sleeve and the base plate through hole is not sufficiently filled with the adhesive, resulting in poor adhesion.

The present invention was made to solve this problem and the main object thereof is to fill a gap between the insulating sleeve and the base plate through hole with an adhesive at a high fill rate.

[1] A member for semiconductor manufacturing apparatus according to the present invention comprising: a ceramic plate having a wafer placement surface at an upper surface and incorporating an electrode; a ceramic plate through hole extending through the ceramic plate in an up-and-down direction; a base plate having electrical conductivity and located adjacent to a lower surface of the ceramic plate; a base plate through hole extending through the base plate in the up-and-down direction; an insulating sleeve inserted into the base plate through hole and having an outer circumferential surface adhered to an inner circumferential surface of the base plate through hole with an adhesive layer therebetween; and a sleeve through hole extending through the insulating sleeve in the up-and-down direction and communicating with the ceramic plate through hole, wherein the insulating sleeve has at least one ring-shaped or spiral outer circumferential groove on the outer circumferential surface except for an upper end portion of the insulating sleeve.

In the member for semiconductor manufacturing apparatus, the insulating sleeve has at least one ring-shaped or spiral outer circumferential groove on the outer circumferential surface except for an upper end portion. Before the insulating sleeve is inserted into and adhered to the base plate through hole, an adhesive is applied onto the outer circumferential surface of the insulating sleeve. In such a state, the insulating sleeve is inserted into the base plate through hole, and then the adhesive is solidified to form an adhesive layer. The insulating sleeve is inserted into the base plate through hole from the upper end portion. The upper end portion, which does not have the outer circumferential groove, has the outer diameter that is not reduced. Thus, at the start of insertion of the upper end portion of the insulating sleeve into the base plate through hole, the central axis of the insulating sleeve does not largely tilt with respect to the central axis of the base plate through hole. The adhesive on the outer circumferential surface is unlikely to be scraped off by the base plate through hole. Furthermore, a scraped off adhesive can stay in the outer circumferential groove, and thus the adhesive fills the gap between the insulating sleeve and the base plate through hole at a high fill rate. This enables the insulating sleeve to be firmly adhered to the base plate through hole.

[2] In the member for semiconductor manufacturing apparatus according to the present invention (the member for semiconductor manufacturing apparatus according to the above [1]), the outer circumferential groove may be the ring-shaped groove, and the insulating sleeve may include a plurality of ring-shaped grooves on the outer circumferential surface. The configuration having a plurality of ring-shaped outer circumferential grooves is likely to have a higher fill rate of the adhesive that fills the gap between the insulating sleeve and the base plate through hole than a configuration having only one outer circumferential groove.

[3] In the member for semiconductor manufacturing apparatus according to the present invention (the member for semiconductor manufacturing apparatus according to the above [2]), the number of outer circumferential grooves may be not less than 2 and not greater than 4. In this configuration, the number of outer circumferential grooves is appropriate, and thus, compared to a configuration having an excessive number of outer circumferential grooves, this configuration enables relatively easy formation of the insulating sleeve.

[4] In the member for semiconductor manufacturing apparatus according to the present invention (member for semiconductor manufacturing apparatus according to any one of the above [1] to [3]), a lower end portion of the insulating sleeve may not have the outer circumferential groove. A gap between the lower end portion of the insulating sleeve and the base plate through hole can be readily filled with an adhesive without the outer circumferential groove. Thus, even if the outer circumferential groove is omitted from the lower end portion, the adhesion between the insulating sleeve and the base plate through hole can be kept.

[5] In the member for semiconductor manufacturing apparatus according to the present invention (the member for semiconductor manufacturing apparatus according to the above [4]), the lower end portion of the insulating sleeve may be a region extending from a lower end surface of the insulating sleeve to a predetermined height, and the predetermined height may be not less than one third and not greater than one half of a height of the insulating sleeve.

[6] In the member for semiconductor manufacturing apparatus according to the present invention (the member for semiconductor manufacturing apparatus according to any one of the above [1] to [5]), an upper end portion of the insulating sleeve may be a region extending from an upper end surface of the insulating sleeve to a predetermined length, and the predetermined length may be not less than 1 mm and not greater than 3 mm.

DETAILED DESCRIPTION OF THE INVENTION

Figure 1:
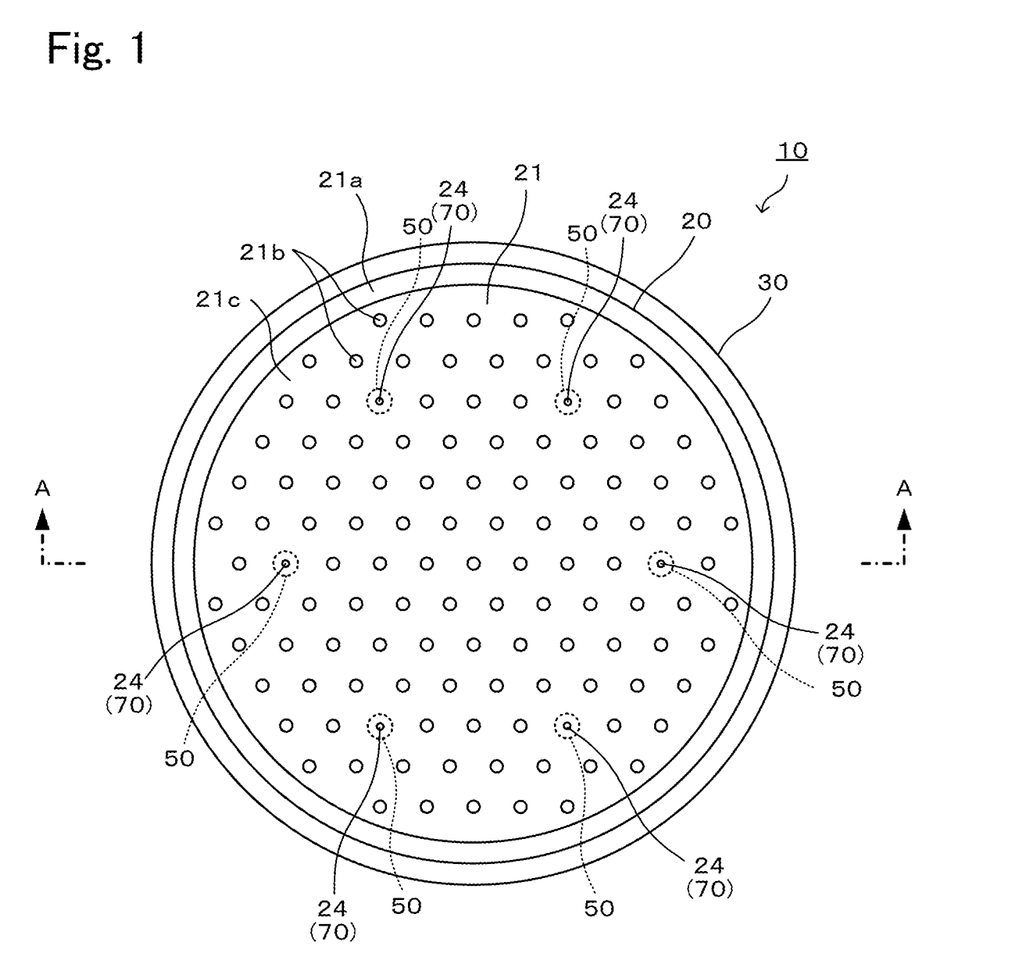
FIG. 1 is a plan view of a wafer placement table 10.
Figure 2:
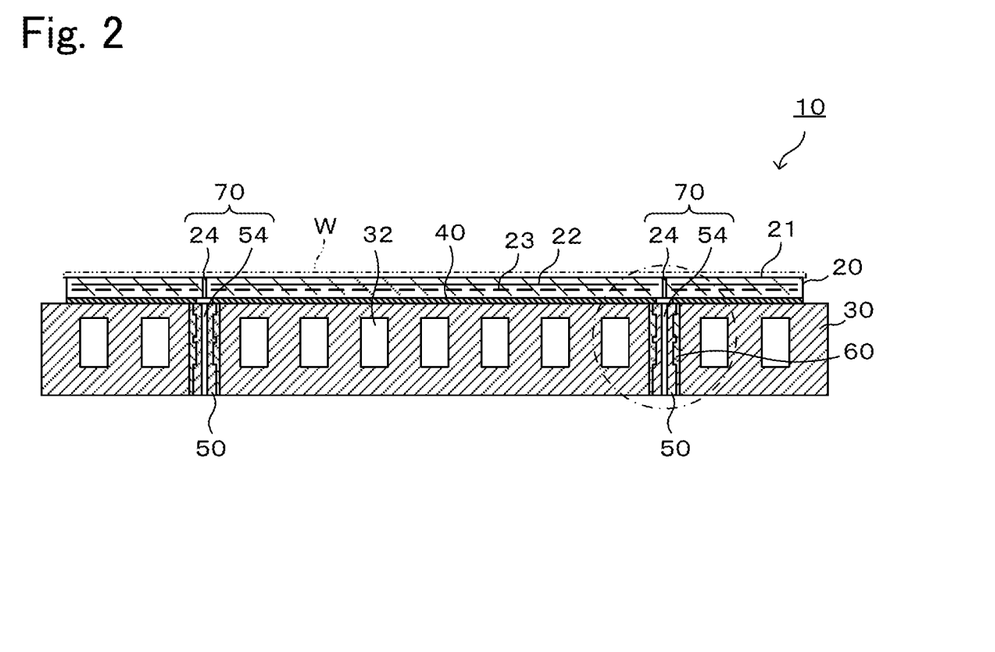
FIG. 2 is a cross-sectional view taken along A-A in FIG. 1.
Figure 3:
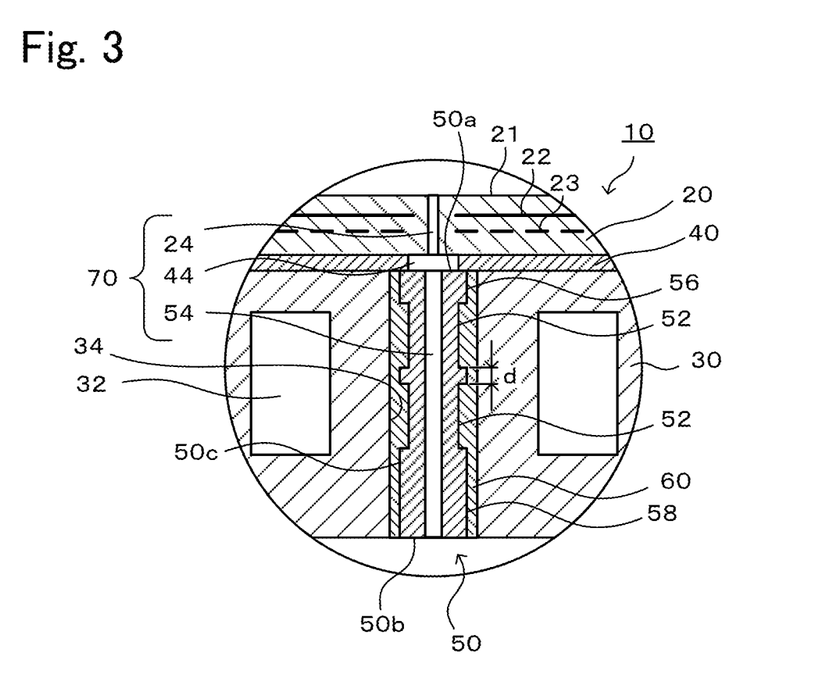
FIG. 3 is a partial magnified view of FIG. 2.
Figure 4:
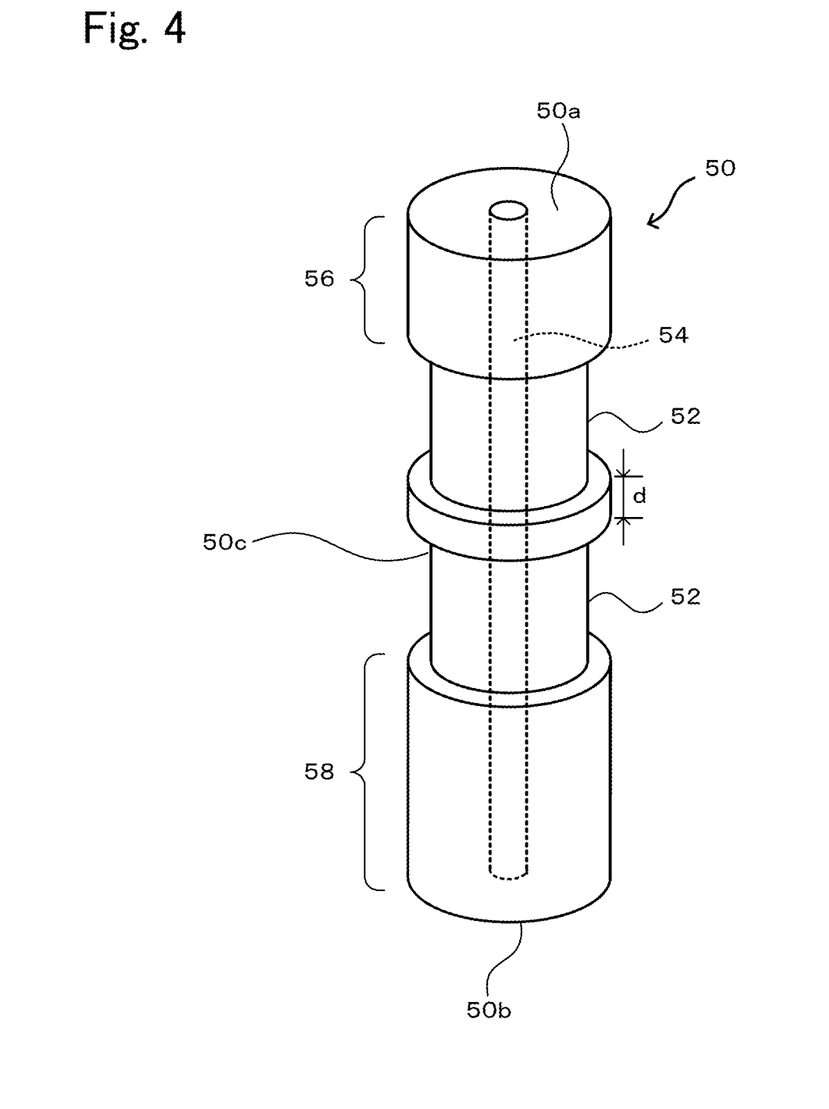
FIG. 4 is a perspective view of an insulating sleeve 50.

Next, a preferable embodiment of the present invention will be described with reference to the drawings. FIG. 1 is a plan view of a wafer placement table 10, FIG. 2 is a cross-sectional view taken along A-A in FIG. 1, FIG. 3 is a partial magnified view of FIG. 2 (magnified view of an area indicated by a dot-dash line), and FIG. 4 is a perspective view of an insulating sleeve 50. In this specification, "up" and "down" do not represent an absolute positional relationship but represents a relative positional relationship. Thus, "up" and "down" can be "down" and "up", "left" and "right", or "front" and "back" depending on the orientation of the wafer placement table 10.

The wafer placement table 10 is an example of the member for semiconductor manufacturing apparatus of this invention and, as illustrated in FIG. 2, includes a ceramic plate 20, a base plate 30, a bonding layer 40, an insulating sleeve 50, and a gas hole 70.

The ceramic plate 20 is a disc (for example, having a diameter of 300 mm and a thickness of 5 mm) formed of ceramic, such as alumina sintered body and aluminum nitride sintered body. The upper surface of the ceramic plate 20 is a wafer placement surface 21 on which a wafer W is placed. The ceramic plate 20 incorporates an electrostatic electrode 22 and a heater electrode 23 in this order from the wafer placement surface 21. As illustrated in FIG. 1, the wafer placement surface 21 of the ceramic plate 20 has an annular seal band 21a along the outer edge and multiple small circular projections 21b over the entire area inwardly from the seal band 21a. The seal band 21a and the small circular projections 21b have the same height. For example, the height is several micrometers to several tens of micrometers. An area of the wafer placement surface 21 without the seal band 21a and the small circular projections 21b is called a reference surface 21c.

The electrostatic electrode 22 is a mesh electrode having a planar shape and is connected to a DC power source through a power feeder (not illustrated). The power feeder is electrically insulated from the base plate 30. When DC voltage is applied across the electrostatic electrode 22, the wafer W is attracted and fixed to the wafer placement surface 21 (specifically, the upper surface of the seal band 21a and the upper surfaces of the small circular projections 21b) by the electrostatic attraction force. When the application of DC voltage is stopped, the wafer W is not attracted and fixed to the wafer placement surface 21.

The heater electrode 23 is a resistance heating element arranged over the entire surface of the ceramic plate 20 in a one-stroke pattern from one end to the other end in plan view. A heater power source is connected to one end and the other end of the heater electrode 23 through a power feeder (not illustrated). The power feeder is electrically insulated from the base plate 30. The heater electrode 23 generates heat when energized to heat the wafer placement surface 21, and thus the wafer W.

The base plate 30 is a disc having high electrical and thermal conductivity (for example, a disc having a diameter equal to or larger than that of the ceramic plate 20 and having a thickness of 25 mm). The base plate 30 has a refrigerant flow path 32 through which a refrigerant circulates in it. The refrigerant flowing through the refrigerant flow path 32 is preferably liquid and preferably has electrical insulating properties. Examples of the electrically insulating liquid include fluorinated inert liquids. The refrigerant flow path 32 extends over the entire base plate 30 in a one-stroke pattern from one end (inlet) to the other end (outlet) in plan view. A supply port and a recovery port of an external refrigerant apparatus (not illustrated) are connected to the one end and the other end of the refrigerant flow path 32, respectively. The refrigerant fed from the supply port of the external refrigerant apparatus to the one end of the refrigerant flow path 32 flows through the refrigerant flow path 32 to the other end of the refrigerant flow path 32 and returns to the recovery port of the external refrigerant apparatus. After the temperature of the refrigerant is controlled, the refrigerant is fed through the supply port to the one end again. The base plate 30 is connected to a radio frequency (RF) power source and is also used as an RF electrode.

The material of the base plate 30 may be, for example, a metal material or a metal-ceramic composite material. Examples of the metal material include Al, Ti, Mo, and alloys of thereof. Examples of the metal-ceramic composite material include metal matrix composites (MMC) and ceramic matrix composites (CMC). Specific examples of the composite materials include a material containing Si, SiC, and Ti (may be referred to as SiSiCTi) and a material containing a porous SiC body impregnated with Al and/or Si, and a $Al_2O_3$—TiC composite material. The material of the base plate 30 is preferably a material having a coefficient of thermal expansion close to that of the material of the ceramic plate 20.

Here, the bonding layer 40 is a resin adhesive layer and bonds the lower surface of the ceramic plate 20 to the upper surface of the base plate 30. Examples of the material of the resin adhesive layer include insulating resins, such as epoxy resins, acrylic resins, and silicone resins.

The insulating sleeve 50 is housed in the base plate through hole 34. The base plate through hole 34 is a hole extending through the base plate 30 in the up-and-down direction and does not extend through the refrigerant flow path 32. The insulating sleeve 50 is a member having a substantially cylindrical shape and formed of an electrically insulating material (for example, the same material as the ceramic plate 20) and has a sleeve through hole 54 extending through the insulating sleeve 50 in the up-and-down direction along the central axis of the insulating sleeve 50. The outer circumferential surface 50c of the insulating sleeve 50 is adhered to the inner circumferential surface of the base plate through hole 34 with an adhesive layer 60 therebetween. Examples of the material of the adhesive layer 60 include insulating resins, such as epoxy resins, acrylic resins, and silicone resins. In FIGS. 2 and 3, the adhesive layer 60 fills a gap between the outer circumferential surface 50c of the insulating sleeve 50 and the inner circumferential surface of the base plate through hole 34 without any space, but a small space may be left therebetween. The outer circumferential surface 50c of the insulating sleeve 50 has multiple (here, two) ring-shaped outer circumferential grooves 52. The insulating sleeve 50 has the outer circumferential grooves 52 on the outer circumferential surface 50c except for the upper end portion (end portion adjacent to the ceramic plate) 56. The upper end portion 56 is a region extending from the upper end surface (end surface adjacent to the ceramic plate) 50a of the insulating sleeve 50 to a predetermined length. The predetermined length is preferably not less than 1 mm and not greater than 3 mm, more preferably not less than 1.5 mm and not greater than 2.5 mm. The insulating sleeve 50 does not have the outer circumferential groove 52 on the lower end portion 58. The lower end portion 58 is a region extending from the lower end surface (end surface away from the ceramic plate 20) 50b of the insulating sleeve 50 to a predetermined height. The predetermined height is preferably not less than one third and not greater than one half of the height of the insulating sleeve 50.

It is preferable that the distance d (see FIG. 3) between the adjacent outer circumferential grooves 52, 52 be short. For example, the distance d is preferably not greater than 3 mm, more preferably not greater than 2.5 mm, and still more preferably not greater than 2 mm. It is preferable that the depth of the outer circumferential groove 52 be large. For example, the depth is preferably not less than 0.25 mm, more preferably not less than 0.5 mm, and still more preferably not less than 0.7 mm. The depth of the outer circumferential groove 52 may be small if the number of outer circumferential grooves 52 on the outer circumferential surface 50c of the insulating sleeve 50 is large. It is preferable that the number of outer circumferential grooves 52 be large. However, if the number is too large, the production of the insulating sleeve 50 becomes difficult, and thus it is preferable that the number be not less than 2 and not greater than 4.

The gas hole 70 consists of a ceramic plate through hole 24, a bonding layer through hole 44, and the sleeve through hole 54. The ceramic plate through hole 24 extends through the ceramic plate 20 in the up-and-down direction (thickness direction). The ceramic plate through hole 24 has an opening in the reference surface 21c of the wafer placement surface 21. The electrostatic electrode 22 and the heater electrode 23 are not exposed through the inner circumferential surface of the ceramic plate through hole 24. In other words, the inner circumferential surface of the ceramic plate through hole 24 is covered with ceramic. The bonding layer through hole 44 extends through the bonding layer 40 in the up-and-down direction (thickness direction) and communicates with the ceramic plate through hole 24. The inner diameter of the bonding layer through hole 44 is larger than the inner diameter of the ceramic plate through hole 24. The bonding layer through hole 44 has an edge on the upper end surface 50a of the insulating sleeve 50. The sleeve through hole 54 communicates with the ceramic plate through hole 24 and the bonding layer through hole 44. The inner diameter of the sleeve through hole 54 is larger than the inner diameter of the ceramic plate through hole 24 and is smaller than the inner diameter of the bonding layer through hole 44. The gas hole 70 is used to feed a heat transfer gas to the wafer placement surface 21.

Figure 5A:
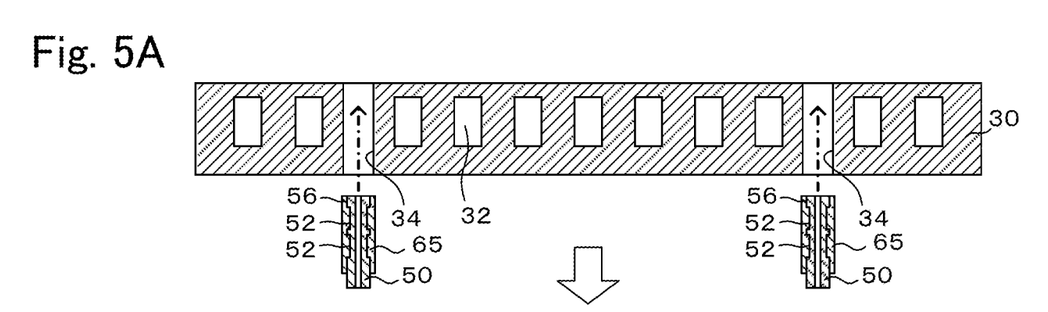
FIGS. 5A to 5C illustrate processes of producing the wafer placement table 10.
Figure 5B:
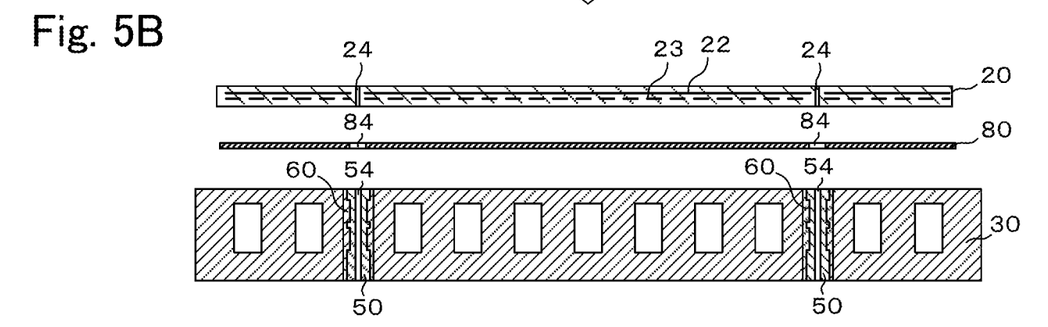
Figure 5C:
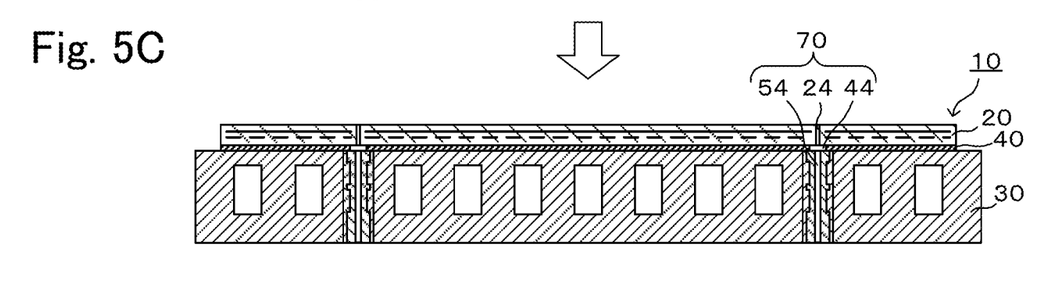

Next, an example of a process of producing the wafer placement table 10 will be described with reference to FIGS. 5A to 5C. FIGS. 5A to 5C illustrate processes of producing the wafer placement table 10.

First, the base plate 30 and the insulating sleeve 50 are provided. Then, a high-viscosity adhesive 65 is applied to the outer circumferential surface 50c of the insulating sleeve 50, and the insulating sleeve 50 is inserted into the base plate through hole 34 from the upper end portion 56 (FIG. 5A).

The upper end portion 56 of the insulating sleeve 50 has a larger diameter than the portion having the outer circumferential groove 52. Thus, at the start of insertion of the upper end portion 56 of the insulating sleeve 50 into the base plate through hole 34, the central axis of the upper end portion 56 does not largely tilt with respect to the central axis of the base plate through hole 34. Furthermore, as the insertion of the insulating sleeve 50 into the base plate through hole 34 proceeds, a portion of the adhesive 65 is scraped off by the base plate through hole 34, but the scraped-off adhesive 65 enters and stays in the outer circumferential groove 52. Thus, when the upper end surface 50a of the insulating sleeve 50 became flush with the upper surface of the base plate 30, the adhesive 65 fills a gap between the outer circumferential surface 50c of the insulating sleeve 50 and the inner circumferential surface of the base plate through hole 34 at a high fill rate. The adhesive 65 becomes the adhesive layer 60 when cured (FIG. 5B). FIG. 5A illustrates a state in which the insulating sleeve 50 is inserted from the bottom of the base plate 30. However, FIG. 5A may be turned upside down, and the insulating sleeve 50 may be inserted from the top of the base plate 30.

Then, the ceramic plate 20 and the bonding sheet 80 are provided (FIG. 5B). The bonding sheet 80 has a layer of adhesive (for example, thermosetting resin adhesive) on upper and lower surfaces. The bonding sheet 80 has preformed sheet through holes 84 that will eventually become bonding layer through holes 44. Then, a ceramic plate 20 is stacked on the upper surface of the base plate 30 with the bonding sheet 80 therebetween. At this time, the plates are arranged so that the sleeve through hole 54, the sheet through hole 84, and the ceramic plate through hole 24 are in communication. Then, the laminate is pressurized while heated, and then cooled. This allows the ceramic plate 20 and the base plate 30 to be bonded to each other by the bonding layer 40. Furthermore, the ceramic plate through hole 24, the bonding layer through hole 44, and the sleeve through hole 54, which are in communication, form a gas hole 70. Thus, the wafer placement table 10 is formed (FIG. 5C).

Next, a usage example of the wafer placement table 10 having the above-described configuration will be described. First, the wafer W is placed on the wafer placement surface 21 of the wafer placement table 10 mounted in a chamber (not illustrated). Then, the chamber is depressurized by a vacuum pump to a predetermined vacuum degree, and DC voltage is applied across the electrostatic electrode 22 of the ceramic plate 20 to generate an electrostatic attraction force. This allows the wafer W to be attracted and held by the wafer placement surface 21 (specifically, the upper surface of the seal band 21a and the upper surfaces of the small circular projections 21b). Furthermore, the heater electrode 23 is energized to heat the ceramic plate 20 so that the wafer W is heated to a predetermined temperature. In addition, backside gas is introduced from a gas cylinder (not illustrated) to the sleeve through hole 54 constituting the gas hole 70. The backside gas may be a heat transfer gas (for example, He gas). The backside gas introduced into the gas hole 70 is filled and sealed in the space between the rear surface of the wafer W and the reference surface 21*c* of the wafer placement surface 21 (the space surrounded by the rear surface of the wafer W, and the seal band 21*a*, small circular projections 21*b*, and the reference surface 21*c* of the wafer placement surface 21). The presence of the backside gas increases efficiency of heat conduction between the wafer W and the ceramic plate 20. Next, a reaction gas atmosphere having a predetermined pressure (for example, several tens to several hundreds of Pa) is created in the chamber. In this state, RF voltage is applied between an upper electrode (not illustrated) on the ceiling of the chamber and the base plate 30 of the wafer placement table 10 to generate plasma. The surface of the wafer W is treated by the generated plasma. A refrigerant is circulated in the refrigerant flow path 32 of the base plate 30 as appropriate.

In the wafer placement table 10 described in detail above, the insulating sleeve 50 has the ring-shaped outer circumferential groove 52 on the outer circumferential surface 50*c* except for the upper end portion 56. Before the insulating sleeve 50 is inserted into and adhered to the base plate through hole 34, an adhesive is applied onto the outer circumferential surface 50*c* of the insulating sleeve 50. In such a state, the insulating sleeve 50 is inserted into the base plate through hole 34, and then the adhesive is solidified to form the adhesive layer 60. The insulating sleeve 50 is inserted into the base plate through hole 34 from the upper end portion 56. The upper end portion 56, which does not have the outer circumferential groove 52, has the outer diameter that is not reduced. Thus, at the start of insertion of the upper end portion 56 of the insulating sleeve 50 into the base plate through hole 34, the central axis of the insulating sleeve 50 does not largely tilt with respect to the central axis of the base plate through hole 34. The adhesive on the outer circumferential surface 50*c* is unlikely to be scraped off by the base plate through hole 34. Furthermore, a scraped off adhesive can stay in the outer circumferential groove 52, and thus the adhesive fills the gap between the insulating sleeve 50 and the base plate through hole 34 at a high fill rate. This enables the insulating sleeve 50 to be firmly adhered to the base plate through hole 34.

Instead of the fill rate of the adhesive that fills the gap between the insulating sleeve 50 and the base plate through hole 34, the length of the adhesive that fills the gap in the up-and-down direction (fill length) may be used as an indicator.

Furthermore, the insulating sleeve 50 has two outer circumferential grooves 52 on the outer circumferential surface 50*c*. This configuration is likely to have a higher fill rate of the adhesive that fills the gap between the insulating sleeve 50 and the base plate through hole 34 than a configuration having one outer circumferential groove 52.

Furthermore, compared to a configuration having an excessive number of outer circumferential grooves 52, this configuration having two outer circumferential grooves 52 enables relatively easy formation of the insulating sleeve 50.

Furthermore, the lower end portion 58 of the insulating sleeve 50 does not have the outer circumferential groove 52. A gap between the lower end portion 58 of the insulating sleeve 50 and the base plate through hole 34 can be readily filled with an adhesive without the outer circumferential groove 52. Thus, even if the outer circumferential groove 52 is omitted from the lower end portion 58, the adhesion between the insulating sleeve 50 and the base plate through hole 34 can be kept.

The present invention should not be limited to the above-described embodiment and may be implemented in various modes without departing from the technical scope of the present invention.

Figure 6:
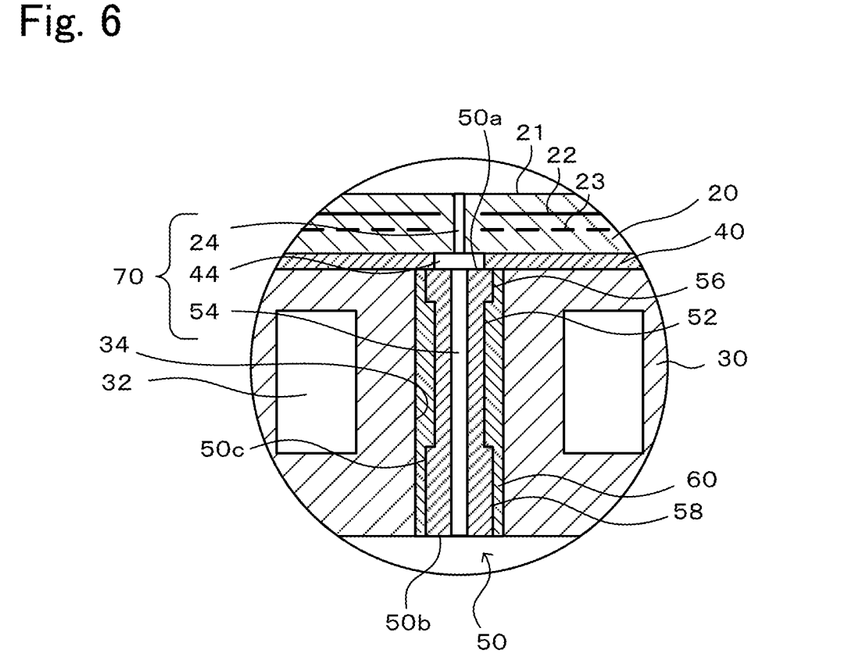
FIG. 6 is a partial magnified view of a vertical cross-sectional view illustrating another example of the wafer placement table 10.
Figure 7:
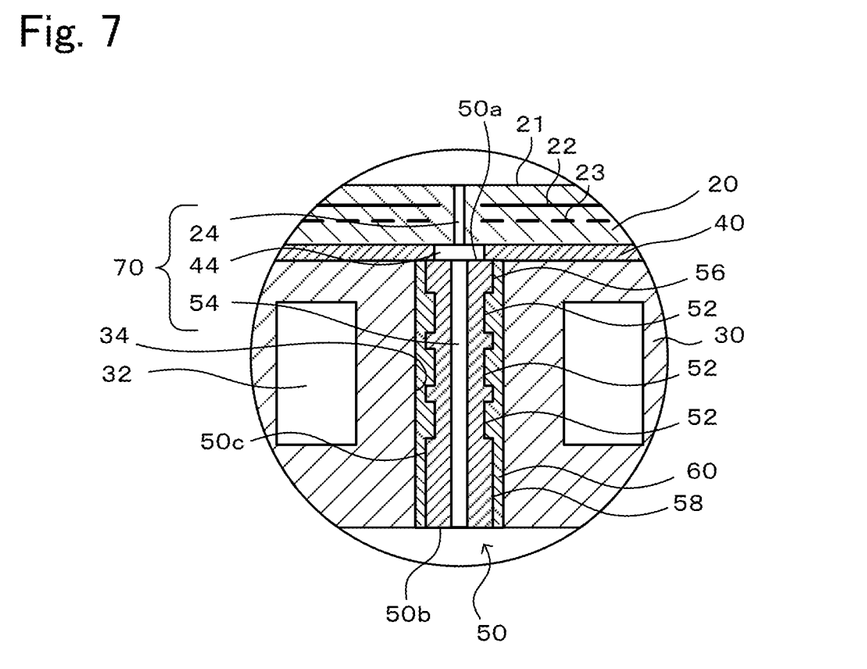
FIG. 7 is a partial magnified view of a vertical cross-sectional view illustrating another example of the wafer placement table 10.
Figure 8:
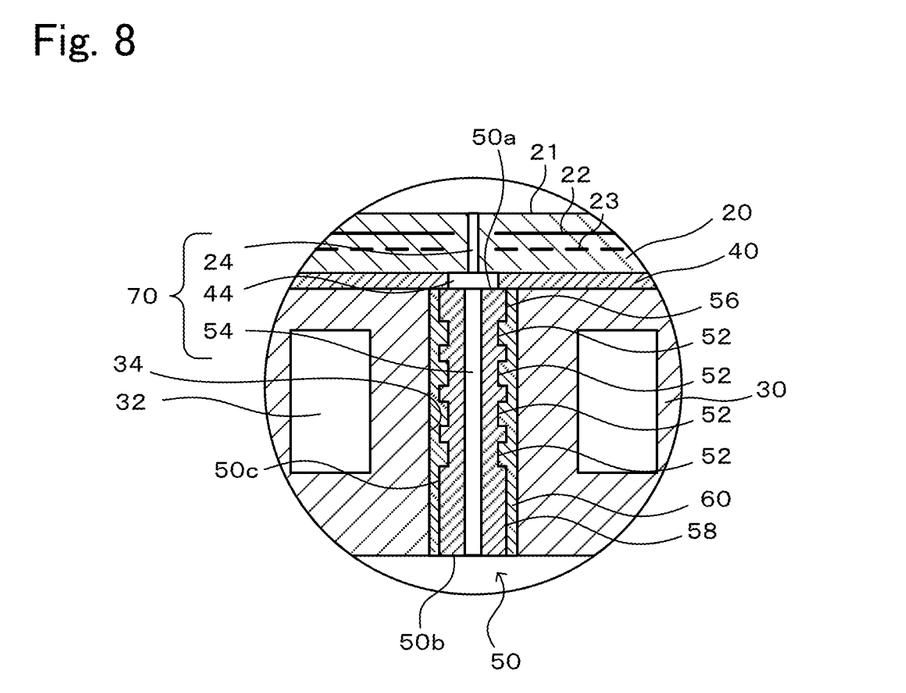
FIG. 8 is a partial magnified view of a vertical cross-sectional view illustrating another example of the wafer placement table 10.

In the above-described embodiment, the insulating sleeve 50 having two outer circumferential grooves 52 is described as an example. However, this should not be construed as limiting. For example, the insulating sleeve 50 may have one ring-shaped outer circumferential groove 52 on the outer circumferential surface 50*c* as illustrated in FIG. 6, may have three ring-shaped outer circumferential grooves 52 on the outer circumferential surface 50*c* as illustrated in FIG. 7, or may have four ring-shaped outer circumferential grooves 52 on the outer circumferential surface 50*c* as illustrated in FIG. 8. In FIGS. 6 to 8, the same symbols are assigned to the same components as those in the above-described embodiment. This can also provide the same effect as the above-described embodiment. Furthermore, the fill rate of the adhesive that fills the gap between the insulating sleeve 50 and the base plate through hole 34 tends to increase as the number of outer circumferential grooves 52 increases. When the number of outer circumferential groove 52 is the same, the fill rate of the adhesive that fills the gap between the insulating sleeve 50 and the base plate through hole 34 tends to increase as the depth of the outer circumferential groove 52 increases.

In the above-described embodiment, the insulating sleeve 50 has the ring-shaped outer circumferential groove 52 on the outer circumferential surface 50*c* but may have a spiral outer circumferential groove. The insulating sleeve 50 may have the spiral outer circumferential groove on the outer circumferential surface 50*c* except for the upper end portion 56 and the lower end portion 58. This can also provide substantially the same effect as the above-described embodiment.

In the above-described embodiment, as a method of producing the wafer placement table 10, the insulating sleeve 50 is adhered to the base plate through hole 34 of the base plate 30 first, and then the base plate 30 is adhered to the ceramic plate 20. However, this should not be construed as limiting. For example, the base plate 30 may be adhered to the ceramic plate 20 first, and then the insulating sleeve 50 may be adhered to the base plate through hole 34 of the base plate 30.

In the above-described embodiment, a resin adhesive layer is described an example of as the bonding layer 40. However, this should not be construed as limiting. For example, the bonding layer 40 may be a metal bonding layer. The metal bonding layer may be formed by a known TCB (thermal compression bonding) using a metal bonding material (for example, Al—Mg bonding material or Al—Si—Mg bonding material).

In the above-described embodiment, the ceramic plate 20 incorporates the electrostatic electrode 22 and the heater electrode 23. However, this should not be construed as limiting. For example, the ceramic plate 20 may incorporate only one of the electrostatic electrode 22 and the heater electrode 23. Alternatively, the heater electrode 23 may be incorporated in two or more layers in the thickness direction.

In the above-described embodiment, the ceramic plate through hole 24, the bonding layer through hole 44, and the sleeve through hole 54 are used as the gas hole 70. However, this should not be construed as limiting. For example, the ceramic plate through hole 24, the bonding layer through hole 44, and the sleeve through hole 54 may be used as a lift pin hole. The lift pin hole receives a lift pin that moves the wafer W up and down with respect to the wafer placement surface 21. When the wafer W is supported by three lift pins, for example, the lift pin holes are provided at three locations.

International Application No. PCT/JP2022/030758, filed on Aug. 12, 2022, is incorporated herein by reference in its entirety.

What is claimed is:

1. A member for semiconductor manufacturing apparatus comprising:
   a ceramic plate having a wafer placement surface at an upper surface, and incorporating an electrode;
   a ceramic plate through hole extending through the ceramic plate in an up-and-down direction;
   a base plate having electrical conductivity and located adjacent to a lower surface of the ceramic plate;
   a base plate through hole extending through the base plate in the up-and-down direction;
   an insulating sleeve inserted into the base plate through hole and having an outer circumferential surface adhered to an inner circumferential surface of the base plate through hole with an adhesive layer therebetween;
   a sleeve through hole extending through the insulating sleeve in the up-and-down direction and communicating with the ceramic plate through hole, wherein the insulating sleeve has at least one ring-shaped or spiral outer circumferential groove on the outer circumferential surface of the insulating sleeve except for an upper end portion of the insulating sleeve, and
   a gap between the inner circumferential surface of the base plate through hole and the outer circumferential surface of the insulating sleeve is formed from an upper end surface of the insulating sleeve to a lower end surface of the insulating sleeve, and
   the adhesive layer is filled in the gap.

2. The member for semiconductor manufacturing apparatus according to claim 1, wherein the outer circumferential groove is the ring-shaped groove, and the insulating sleeve includes a plurality of ring-shaped grooves on the outer circumferential surface.

3. The member for semiconductor manufacturing apparatus according to claim 2, wherein the number of outer circumferential grooves is not less than 2 and not greater than 4.

4. The member for semiconductor manufacturing apparatus according to claim 1, wherein a lower end portion of the insulating sleeve does not have the outer circumferential groove.

5. The member for semiconductor manufacturing apparatus according to claim 4, wherein the lower end portion of the insulating sleeve is a region extending from the lower end surface of the insulating sleeve to a predetermined height, and the predetermined height is not less than one third and not greater than one half of a height of the insulating sleeve.

6. The member for semiconductor manufacturing apparatus according to claim 1, wherein the upper end portion of the insulating sleeve is a region extending from the upper end surface of the insulating sleeve to a predetermined length, and the predetermined length is not less than 1 mm and not greater than 3 mm.

7. The member for semiconductor manufacturing apparatus according to claim 1, wherein the adhesive layer is in the outer circumferential groove.

8. The member for semiconductor manufacturing apparatus according to claim 1, further including a bonding layer between the lower surface of the ceramic plate and an upper surface of the base plate with a bonding layer through hole extending through the bonding layer in an up-and-down direction.

9. The member for semiconductor manufacturing apparatus according to claim 8, wherein the inner diameter of the bonding layer through hole is larger than the inner diameter of the ceramic plate through hole.

10. The member for semiconductor manufacturing apparatus according to claim 8, wherein the inner diameter of the bonding layer through hole is larger than the inner diameter of the sleeve through hole.

* * * * *